United States Patent [19]
Aimoto et al.

[11] Patent Number: 5,714,893
[45] Date of Patent: Feb. 3, 1998

[54] SIGNAL TRANSMISSION CIRCUIT

[75] Inventors: Yoshiharu Aimoto; Tohru Kimura; Yoshikazu Yabe, all of Tokyo, Japan

[73] Assignee: NEC Corporation, Tokyo, Japan

[21] Appl. No.: 619,312

[22] Filed: Mar. 21, 1996

[30] Foreign Application Priority Data

Mar. 24, 1995 [JP] Japan .................................. 7-091417

[51] Int. Cl.$^6$ ...................................................... G11C 11/40
[52] U.S. Cl. ........................... 327/51; 327/50; 327/403; 365/203
[58] Field of Search ........................ 327/530, 271, 327/50, 51, 52, 57, 403; 365/203, 205, 226

[56] References Cited

U.S. PATENT DOCUMENTS

| | | | |
|---|---|---|---|
| 4,208,730 | 6/1980 | Dingwall et al. | 327/51 |
| 5,539,700 | 7/1996 | Kawahara et al. | 365/203 |

OTHER PUBLICATIONS

A. Tanabe et al.; "A 30-ns 64-Mb DRAM with Built-in Self-Test and Self-Repair Function"; IEEE Journal of Solid-State Circuits, vol. 27, No. 11, Nov. 1992, pp. 1525–1533.

*Primary Examiner*—Timothy P. Callahan
*Assistant Examiner*—Dinh T. Le
*Attorney, Agent, or Firm*—Whitham, Curtis, Whitham & McGinn

[57] ABSTRACT

A signal transmission circuit suitable for a memory device includes a signal generating section for generating a data signal from a power source, a pair of signal transmission lines for transferring the data signal by transferring signal charge associated by the data signal, an amplifying section for amplifying the data signal transferred by the signal transmission lines, and a precharge section for precharging the output of the signal generating section, the pair of signal transmission lines and the output of the amplifying section to a median potential level between the potential levels of the power source. The precharge section provides power saving as well as a larger noise margin.

3 Claims, 3 Drawing Sheets

SIGNAL TRANSMISSION CIRCUIT

BACKGROUND OF THE INVENTION (a) Field of the Invention

The present invention relates to a signal transmission circuit and, more particularly, to a signal transmission circuit including a pair of signal transmission lines having a large parasitic capacitance.

(b) Description of the Related Art

In a conventional circuit for transmitting a data signal by using a pair of signal transmission lines, both the pair of signal transmission lines are first precharged up to a power source level or down to a ground level, following which the potential of one of the signal transmission lines is changed for signal transmission.

Referring to FIG. 1 showing an example of a conventional signal transmission circuit including a pair of signal lines, the circuit includes a signal generating section 1 for generating a data signal to be transmitted, a signal transfer section 2, including the pair of signal transmission lines, for transferring the data signal output from the signal generating section 1, an amplifying section 3 for amplifying the data signal transferred by the signal transfer section 2, a pair of first transfer gates 4 for effecting coupling between the signal generating section 1 and the signal transfer section 2, a pair of second transfer gates 5 for effecting coupling between the signal transfer section 2 and the amplifying section 3, and a precharge section 7 for precharging the signal transmission lines.

The signal transmission circuit shown in FIG. 1 is typically used in a memory device to read out the data stored in a memory cell toward outside the memory device. Generally, the data signal transmitted to the signal transfer section 2 has a small amplitude because of the large parasitic capacitance of the signal transfer section 2 with respect to the output capacitance of the signal generating section 1. In a memory device, the signal generating section 1 is generally composed of memory cells, pairs of bit lines, column gates and a sense amplifier, the signal transfer section 2 is usually composed of a pair of signal transmission lines, and the amplifying section 3 is implemented by a data amplifier. There are two cases of signal transmission lines in which the precharge for the signal transmission lines is executed to raise both the pair of lines to a power source level or lower the same to a ground level.

FIG. 2 schematically shows one of the two cases in the signal transmission circuit of FIG. 1, as mentioned above, in which both the pair of signal transmission lines are precharged to a power source level to provide waveforms of a data signal on the output pair of the signal generating section 1 (FIG. 2(a)), on the transmission lines of the signal transfer section 2 (FIG. 2(b)) and on the output pair of the amplifying section 3 (FIG. 2(c)). Each of the sections includes a pair of signal lines designated by 11 and 12 in the drawings. The pair of signal transmission lines of the signal transfer section 2 are precharged to a power source level before each cycle of signal transmission by the precharge section 7. FIG. 3 shows, similarly to FIG. 2, the other case in which the pair of signal transmission lines are precharged to the ground level. The operation illustrated in FIG. 3 is similar to that illustrated in FIG. 2.

In operation of the signal transmission circuit of FIG. 1, the precharge section 7 first precharges the pair of signal transmission lines of the signal transfer section 2 to a power source level or to a ground level, then a data signal forming a complementary signal is read out from the signal generating section 1 to raise the potential difference between the pair of outputs of the signal generating section 1 up to a full swing level. Subsequently, the first transfer gate 4 is made conductive so as to transfer the data signal to the signal transfer section 2.

Assuming that the output capacitance of the signal generating section 1, the input capacitance of the signal transfer section 2, the full swing potential difference between the pair of outputs (11 and 12) of the signal generating section 1, and full swing potential difference between the pair of outputs (11 and 12) of the data transfer section 2 are $C_1$, $C_2$, $Vi$ and $Vs$, respectively, the potential difference $Vs$ can be expressed as follows:

$$Vs = \{C_1/(C_1+C_2)\} \times Vi \qquad (1)$$

Since the input capacitance $C_2$ is generally far greater than the output capacitance $C_1$ the potential difference $Vs$ produced on the pair of signal transmission lines is extremely small as schematically shown in FIGS. 2 and 3. The small amplitude data signal on the signal transfer section 2 is supplied to the amplifying section 3 by making the second transfer gate 5 conductive. The amplifying section 3 amplifies the thus input data signal so as to provide thereto a suitable amplitude corresponding to the power source voltage, and then outputs the amplified data signal toward outside the circuit.

With the conventional circuit as described above, the potential of a data signal is changed from the precharged level, i.e., power source level or ground level, so that the data signal is generally affected in the conventional circuit by variations in the potential of the power source or of the ground, resulting in a smaller noise margin. Further, due to driving a large capacitive load of the signal transmission line, the conventional circuit consumes a large electric charge of electric power.

SUMMARY OF THE INVENTION

In view of the foregoing, an object of the present invention is to provide a signal transmission circuit suitable for a memory device and having a lower power dissipation during signal transmission therethrough.

The present invention provides a signal transmission circuit comprising a signal generating section for generating a data signal by providing electric charge from a power source having a first potential level and a second potential level, a signal transfer section, having a pair of signal transmission lines, for receiving and transferring the data signal therethrough, an amplifying section for amplifying the data signal transferred by said signal transfer section, and a precharge section for precharging the signal transmission lines of said signal generating section substantially to a median potential between the first potential level and second potential level.

In accordance with the present invention, since the potentials of the signal transmission lines are changed with respect to the median potential between the potentials of the first source level and second source level, one of the pair of signal transmission lines can be swung below the median potential only by discharging electric charge therefrom during the signal transfer. Accordingly, electric power for the signal transmission can be decreased or substantially halved.

Further, it is possible to provide a larger noise margin as compared to the case of precharging the signal transmission lines to the potential of the first potential level or second potential level. It is possible to precharge the pair of transmission lines to the median potential in the signal transmission circuit by coupling the pair of transmission lines to equalize the potentials of the pair of signal transmission lines, with a supplementary electric charge being supplied thereto.

Other and further objects, features and advantages of the present invention will be more apparent from the following description.

DETAILED DESCRIPTION OF THE PREFERRED EMBODIMENT

A preferred embodiment of the present invention will now be described with reference to the accompanying drawings.

Figure 4:
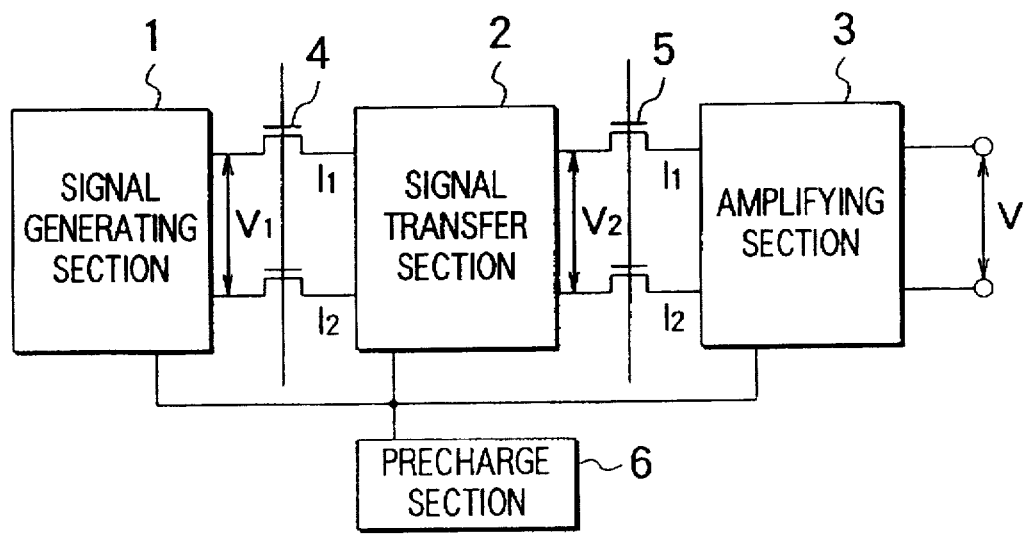
FIG. 4 is a block diagram of a signal transmission circuit according to an embodiment of the present invention.

Referring to FIG. 4, a signal transmission circuit according to the present embodiment has a signal generating section 1 for generating a data signal by providing signal charge from a power source having a first potential level and a second potential level, e.g., a ground level, a signal transfer section 2, including a pair of signal transmission lines, for transferring the data signal provided by the signal generating section 1, an amplifying section 3 for amplifying the data signal transferred by the signal transfer section 2, a first transfer gate 4 for effecting coupling of the signal generating section 1 with the signal transfer section 2, a second transfer gate 5 for effecting coupling of the signal transfer section 2 with the amplifying section 3, and a precharge section 7 for precharging any pair of signal lines for transferring the data signal in each of sections 1, 2 and 3 to a median potential between the first potential level and the second potential level.

The signal transmission circuit may be formed as a memory device in a practical example, in which memory cells, pairs of bit lines and a sense amplifier constitute the signal generating section 1, a pair of data lines constitute the signal transfer section 2, and a data amplifier in the output stage of the memory device constitutes the amplifying section 3.

The signal transfer section 2 does not include a power source for charging the pair of signal transmission lines during the time interval between the time instant for receiving a data signal from the signal generating section 1 and the time instant for providing the data signal to the amplifying section 3. That is, the signal transmission section transfers signal charge from the output of the signal generating section 1 to the input of the amplifying section 3 during transfer of the data signal.

Figure 1:
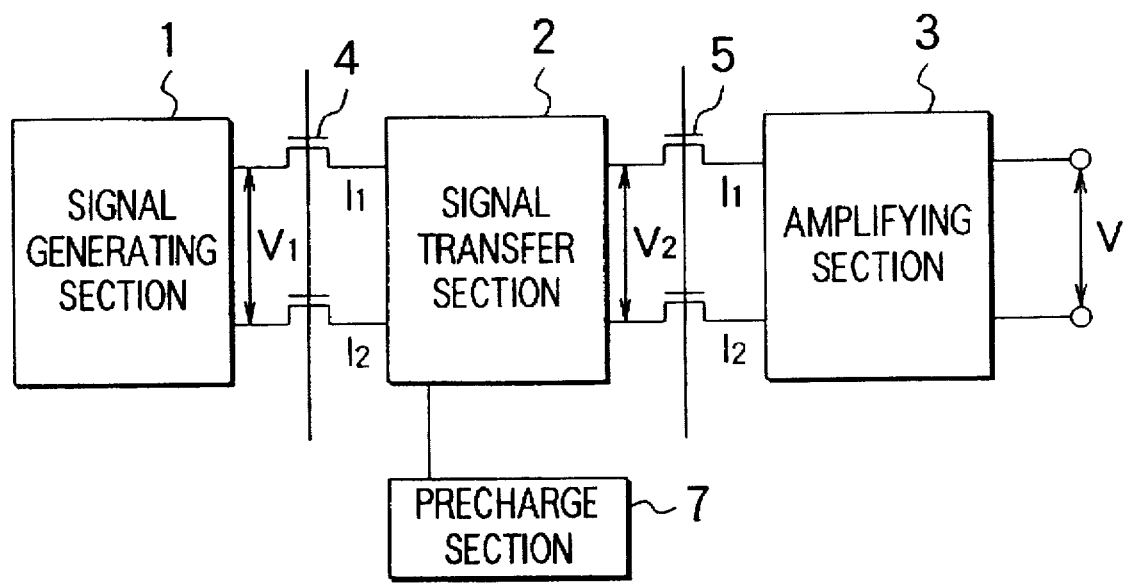
FIG. 1 is a block diagram of a conventional signal transmission circuit.
Figure 2:
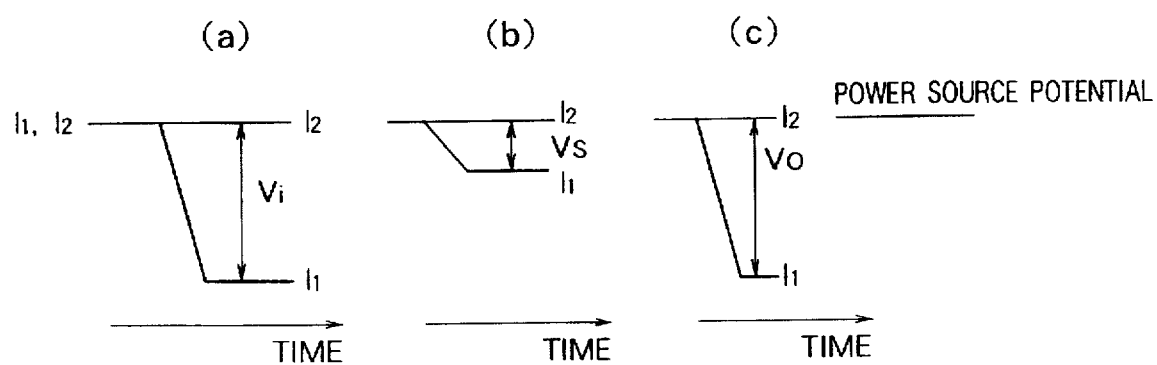
FIGS. 2(a), (b) and (c) are waveform diagrams for illustrating the operation of the conventional signal transmission circuit of FIG. 1.
Figure 3:
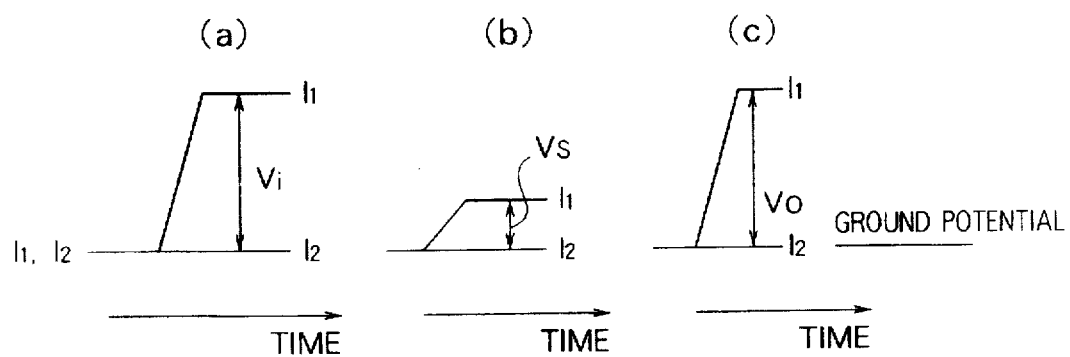
FIGS. 3(a), (b) and (c) are waveform diagrams for illustrating the alternative operation of the conventional signal transmission circuit of FIG. 1.
Figure 5:
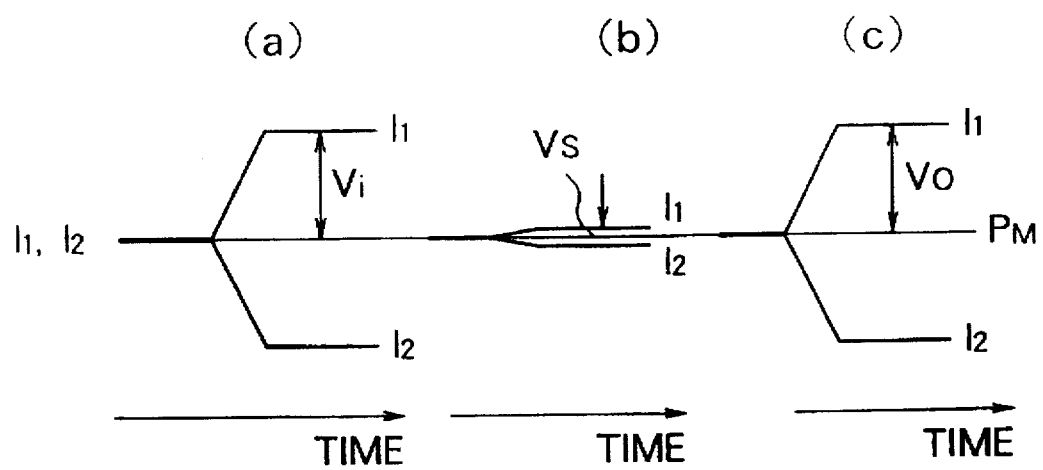
FIGS. 5(a), (b) and (c) are waveform diagrams for illustrating the operation of the signal transmission circuit of FIG. 4.

Referring to FIG. 5, there are shown, similarly to FIGS. 2 and 3, waveforms of a data signal in the signal transmission circuit at respective sections 1, 2 and 3. In operation, the precharge section 6 first precharges any pair of signal lines in the signal generating section 1, the signal transfer section 2 and amplifying section 3 to raise the any pair of signal lines to the median potential level between the power source level and the ground level.

Subsequently, a complementary data signal is output from the data generating section 1. After the potential difference between the pair of outputs of the data generating section 1 shifts from the median potential level to a full swing potential level, the first transfer gate 4 is made conductive so as to transfer the signal charge of the complementary data signal to the signal transfer section 2.

Assuming that the output capacitance of the signal generating section 1, the input capacitance of the signal transfer section 2, the full swing output of the signal generating section 1, which is the potential difference between the maximum output potential of the data signal at one of the outputs of the signal generating section 1 and the median potential level, and a full swing potential difference in the signal transfer section 2, which is the potential difference between the maximum potential level at one of the pair of signal transmission lines and the median potential level are $C_1$, $C_2$, $Vi$ and $Vs$, respectively, then the potential difference $Vs$ is expressed as follows:

$$Vs = \{C_1/(C_1+C_2)\} \times Vi. \quad (2)$$

The data signal supplied from the signal transfer section 2 toward the second transfer gate 5 has only a small amplitude because of the large parasitic capacitance of the pair of signal transmission lines. The small amplitude data signal is supplied to the amplifying section 3 by making the second transfer gate 5 conductive to couple the output end of the signal transfer section 2 with the input of the amplifying section 3. The amplifying section 3 amplifies the small amplitude data signal so as to provide a suitable amplitude thereto corresponding to the power source voltage, and then outputs the amplified data signal.

As described above, in the present embodiment, the potential of the data signal at each of the each pair of signal lines is swung from the median potential level between the power source level and the ground level, with the median potential level being the center of the amplitude of the data signal. Accordingly, the potential of the data signal at one of each pair of transmission lines can be decreased below the median potential only by releasing the charge stored on the one of the signal lines to the ground. Accordingly, it is possible to reduce or halve the power dissipation for data transfer as compared to that of the signal transmission circuit precharging signal lines to a power source level. Also, it is possible to precharge each of the circuit sections to the median potential level by coupling each pair of signal lines to equalize the potentials of the pair of signal lines, with a supplementary power being provided thereto, for power saving.

The signal transmission circuit according to the present embodiment may be modified to have the following circuit configuration. A single signal generating section such as shown in FIG. 4 is followed by a plurality of cascaded circuit sections, each of the cascaded circuit sections being composed of the first transfer gate 4, the signal transfer section 2, the second transfer gate 5, and the amplifying section 3, which are shown in FIG. 3. A precharge section 6 precharges each pair of signal lines in the circuit section to the median potential by using only a small amount of electric charge during the precharge period for effecting power saving.

In the present embodiment, precharging of pairs of signal lines to a median potential provides a small swing of the pair of signal lines during the signal transfer for power saving, as well as a larger noise margin and a small power dissipation in a read circuit of a memory device, for example.

Since the above embodiment is described only as an example, the present invention is not limited to such an embodiment and it will be obvious for those skilled in the art that various modifications or alterations can be easily made based on the above embodiment within the scope of the present invention.

What is claimed is:

1. A signal transmission circuit comprising:
    a signal generating section for generating on an output pair thereof a data signal by providing a signal charge onto sold output pair from a power source having a first potential level and a second potential level;
    a plurality of circuit sections cascaded from said signal generating section and from one another, each of said circuit sections including:
        a pair of signal transmission lines; and
        an amplifying section having an input pair for receiving said data signal to output an amplified data signal at an output pair thereof;
        a pair of transfer gates for coupling said output pair of said signal generating section or said output pair of said amplifier section with said pair of corresponding signal transmission section; and
    a precharge section for precharging said output pair of signal generating sections and said pairs of signal transmission lines and said output pair of said amplifying section of each of said circuit sections substantially to a median potential between potentials of the first potential level and second potential level,
    said pair of signal transmission lines transferring signal charge from said output pair of signal generating section or said output pair of the amplifying section of a preceding one of said circuit sections to said input pair of said amplifying section of a corresponding one of said circuit sections.

2. A signal transmission circuit as defined in claim 1, wherein said precharge section precharges each pair of signal lines in said signal generating section and each pair of signal lines in said amplifying section before the data signal is generated by said signal generating section.

3. A signal transmission circuit as defined in claim 1, wherein said data signal comprises a complementary signal.

* * * * *

UNITED STATES PATENT AND TRADEMARK OFFICE
CERTIFICATE OF CORRECTION

PATENT NO. : 5,714,893
DATED : February 3, 1998
INVENTOR(S) : Yoshiharu Aimoto, Tohru Kimura, Yoshikazu Yabe It is certified that error appears in the above-identified patent and that said Letters Patent is hereby corrected as shown below:

**In column 5 please correct claim 1, line 16 as follows:
change " sold " to -- said --.**

Signed and Sealed this

Twenty-eighth Day of April, 1998

Attest:

BRUCE LEHMAN

Attesting Officer

Commissioner of Patents and Trademarks